US010891850B1

(12) United States Patent
Chen et al.

(10) Patent No.: US 10,891,850 B1
(45) Date of Patent: *Jan. 12, 2021

(54) HUMIDITY CONTROL SYSTEM

(71) Applicant: Waymo LLC, Mountain View, CA (US)

(72) Inventors: Darren Xinhang Chen, Sunnyvale, CA (US); David Gordon Duff, Mountain View, CA (US); Alexander Norton Meade, San Francisco, CA (US)

(73) Assignee: Waymo LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/808,682

(22) Filed: Mar. 4, 2020

Related U.S. Application Data

(63) Continuation of application No. 16/011,141, filed on Jun. 18, 2018, now Pat. No. 10,621,851.

(51) Int. Cl.
*G08B 21/20* (2006.01)
*H05K 5/02* (2006.01)
*G01N 25/66* (2006.01)
*B01D 53/26* (2006.01)

(52) U.S. Cl.
CPC ............ *G08B 21/20* (2013.01); *G01N 25/66* (2013.01); *H05K 5/0213* (2013.01); *B01D 53/261* (2013.01)

(58) Field of Classification Search
CPC .................................................... G08B 21/20
See application file for complete search history.

(56) References Cited

U.S. PATENT DOCUMENTS

| 5,666,813 | A | 9/1997 | Brune |
| 7,195,177 | B2 | 3/2007 | Haws et al. |
| 8,247,097 | B1 | 8/2012 | Duff |
| 9,211,498 | B2 | 12/2015 | Akdogan et al. |
| 2014/0368361 | A1 | 12/2014 | Leblanc |
| 2017/0347473 | A1 | 11/2017 | Freer et al. |
| 2018/0160571 | A1 | 6/2018 | Baker |

OTHER PUBLICATIONS

Lallanilla, Marc , "What is Dew Point?", Live Science, Feb. 11, 2014, 4 pages.

*Primary Examiner* — Nabil H Syed
*Assistant Examiner* — Cal J Eustaquio
(74) *Attorney, Agent, or Firm* — Botos Churchill IP Law

(57) ABSTRACT

Aspects of the disclosure relate to reducing replacing a desiccant cartridge based upon a condensation risk. In one example, first information corresponding to a current dew point within a sensor housing of a sensor and second information identifying temperature data corresponding to a predefined area where the sensor is projected to travel may be received. Based upon the first and second information a condensation risk corresponding to the likelihood of condensation forming within the sensor housing in the event it traveled within the predefined area based upon the current dew point and the temperature data may be determined. Based upon the determined condensation risk, an indication that a desiccant cartridge within the sensor housing should be replaced to reduce the current dew point and the condensation risk may be provided.

20 Claims, 12 Drawing Sheets

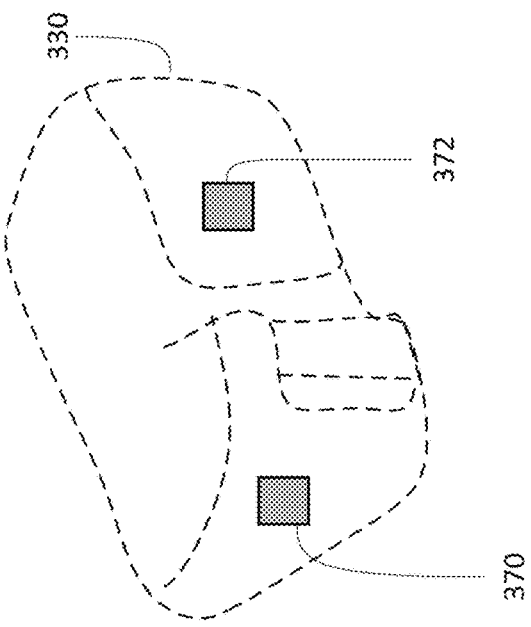
FIGURE 3E
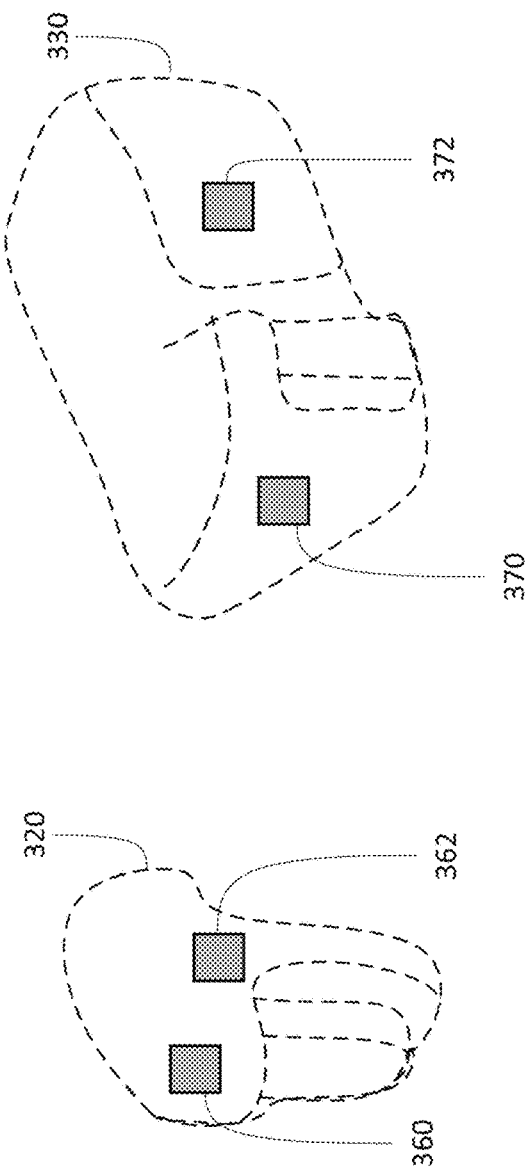
FIGURE 3D
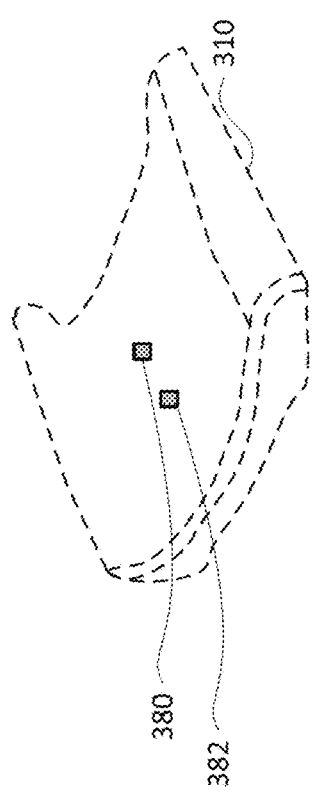
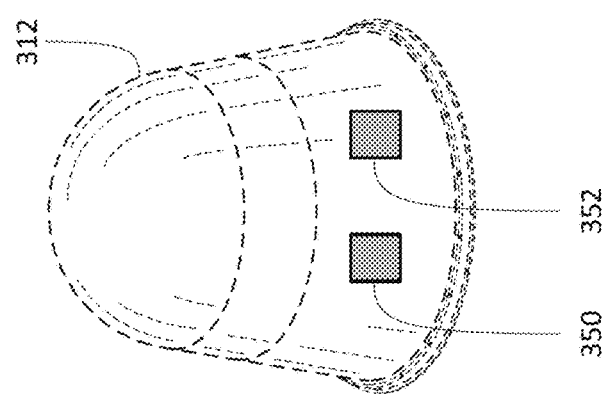
FIGURE 3C
FIGURE 3B

HUMIDITY CONTROL SYSTEM

CROSS REFERENCE TO RELATED APPLICATIONS

The present application is a continuation of U.S. patent application Ser. No. 16/011,141, filed Jun. 18, 2018, the entire disclosure of which is incorporated by reference herein.

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location without the need for additional input from the passenger or any other human. Thus, such vehicles may be used to provide transportation services.

Various types of vehicles, such as cars, trucks, motorcycles, busses, boats, airplanes, helicopters, lawn mowers, recreational vehicles, amusement park vehicles, farm equipment, construction equipment, trams, golf carts, trains, trolleys, etc., may be equipped with various types of sensors in order to detect objects in the vehicle's environment. For example, vehicles, such as autonomous vehicles, may include such LIDAR, radar, sonar, camera, or other such imaging sensors that scan and record data from the vehicle's environment. Sensor data from one or more of these sensors may be used to detect objects and their respective characteristics (position, shape, heading, speed, etc.).

However, these vehicles are often subjected to environmental elements such as rain, snow, dirt, condensation, etc., which can cause a buildup of debris and contaminants on these sensors. Typically, the sensors include a cover to protect the internal sensor components of the sensors from the debris and contaminants, but over time, the cover itself may be subjected to debris and contaminants. As such, the functions of the sensor components may be impeded as signals transmitted and received by the internal sensor components are blocked by the debris and contaminants.

BRIEF SUMMARY

This technology generally relates to preventing condensation from building-up on a sensor to assure adequate operation of the sensor. One aspect includes a method comprising: receiving, by one or more processors, first information corresponding to a current dew point within a sensor housing of a sensor; receiving, by the one or more processors, second information identifying temperature data corresponding to a predefined area where the sensor is projected to travel; determining, by the one or more processors, a condensation risk corresponding to the likelihood of condensation forming within the sensor housing in the event it traveled within the predefined area based upon the current dew point and the temperature data; and based upon the determined condensation risk, providing an indication that a desiccant cartridge within the sensor housing should be replaced to reduce the current dew point and the condensation risk.

In some instances, the first information includes a temperature and relative humidity level within the sensor housing. In some embodiments, the first information includes a saturation percentage of desiccant within the desiccant cartridge. In some instances, the current dew point is determined based upon the temperature and relative humidity level, and the saturation percentage of the desiccant.

In some embodiments, the predefined area includes a projected path of the sensor.

In some instances, the condensation risk is based on a threshold value relative to the dew point. In some instances the condensation risk is based on a temperature range relative to the dew point. In some embodiments, condensation risk is greater when the temperature is within the temperature range and less when the temperature is above the temperature range. In some instances, the temperature range is about 5 degrees Fahrenheit. In some instances, when the temperature is below the dew point, preventing the sensor housing from traveling within the predefined area.

Another aspect includes a system comprising: one or more computing devices; and memory storing instructions, the instructions executable by the one or more computing devices to render the content from the discrete applications, wherein the instructions comprise: receiving first information corresponding to a current dew point within a sensor housing of a sensor; receiving second information identifying temperature data corresponding to a predefined area where the sensor is projected to travel; determining a condensation risk corresponding to the likelihood of condensation forming within the sensor housing in the event it traveled within the predefined area based upon the current dew point and the temperature data; and based upon the determined condensation risk, providing an indication that a desiccant cartridge within the sensor housing should be replaced to reduce the current dew point and the condensation risk.

In some embodiments, the first information includes a temperature and relative humidity level within the sensor housing. In some instances, the first information includes a saturation percentage of desiccant within the desiccant cartridge. In some instances, the current dew point is determined based upon the temperature and relative humidity level, and the saturation percentage of the desiccant.

In some embodiments, the predefined area includes a projected path of the sensor.

In some embodiments, the condensation risk is based on a threshold value relative to the dew point. In some instances, the condensation risk is based on a temperature range relative to the dew point. In some instances, the condensation risk is greater when the temperature is within the temperature range and less when the temperature is above the temperature range. In some instances, the temperature range is about 5 degrees Fahrenheit. In some instances, when the temperature is below the dew point, the sensor housing is prevented from traveling within the predefined area.

BRIEF DESCRIPTION OF THE DRAWINGS

FIGS. 3B-3E are an example representative transparent views of sensor housings in accordance with aspects of the disclosure.

DETAILED DESCRIPTION

Overview

Figure 1:
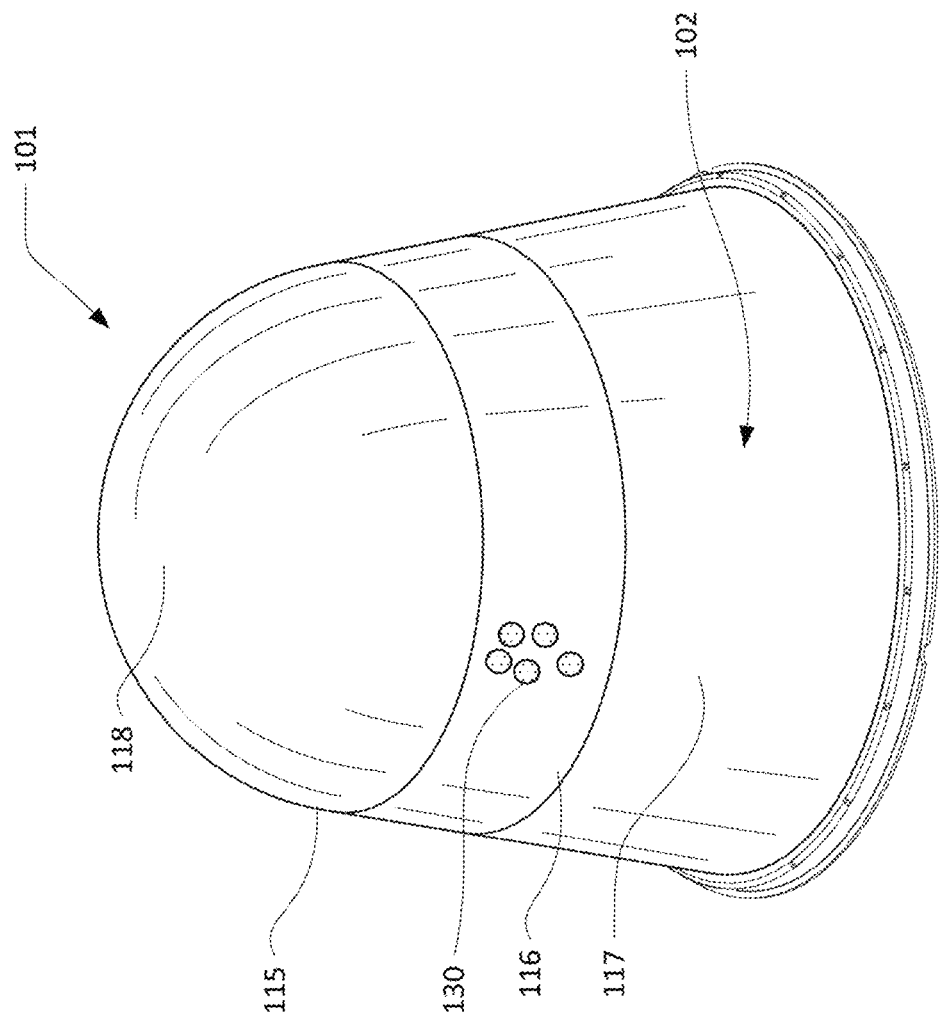
FIG. 1 is an example external view of a sensor housing with condensation in accordance with aspects of the disclosure.

The technology relates to preventing condensation from building-up on a sensor to assure adequate operation of the sensor. In this regard, a sensor may be comprised of internal sensor components and a housing. The housing may protect the internal sensor components from elements, such as rain, snow, dust and other such debris. However, environmental differences between the interior of the sensor (i.e., within the sensor housing) and the senor's external environment (i.e., outside of the sensor housing) may result in the formation of condensation on the interior of the sensor's housing. For instance, and as illustrated in FIG. 1, when the ambient temperature of the interior 102 of a sensor housing 101 is lower than the dew point of the ambient air outside of the sensor, condensation 130 may form on the interior portion of the housing. The condensation 130 may impede the functions of the internal sensor components. In this regard, the signals transmitted and received by the internal sensor components may be blocked from exiting or entering the walls 117, window 116, dome 118, or other portion of the sensor housing 115 by the condensation. This can be exacerbated where sensor housings are not completely sealed and are able to exchange moisture with the vehicle's external environment, which is typically the case as sealed sensor housings require great expense and are difficult to produce, particularly when the sensor housing is not made of glass for safety reasons.

To address the issues of condensation formation in the interior of the sensor housing, a desiccant may be added to the interior of the sensor housing to absorb water vapor. By absorbing water vapor in the interior of the sensor housing, the dew point of the interior of the sensor housing may be reduced. As such, the formation of condensation may only occur at a lower temperature, thereby allowing the sensor to operate in more environments.

The desiccant may be stored within a replaceable and/or removable container, such as a cartridge. The desiccant cartridge may be configured to removeably attach to the sensor, such as attaching to a mount on the sensor's housing. In some instances, the desiccant may be stored in one or more pouches within the cartridge.

The lifespan of the desiccant within a desiccant cartridge may be estimated by tracking the environment which the desiccant is subjected. In this regard, in warmer, more humid environments, the lifespan of the desiccant may be shorter than desiccant in colder, dryer environments as the desiccant will saturate more quickly in the warmer, more humid environment as more moisture is present. Moreover, as the desiccant saturates, the less effective it becomes at preventing the formation of condensation within the sensor housing.

Environmental data internal and external to the locations where a sensor has operated may be monitored to determine the operational lifespan of the desiccant. In this regard, by comparing absolute humidity of the external environment against the absolute humidity within the sensor, the saturation percentage of the desiccant may be determined without having to weigh the desiccant. For instance, the average absolute saturation may be calculated by dividing the average absolute humidity by the average absolute humidity of the external environment observed for that day at the last known location of the vehicle.

The computing device may determine the dew point within the sensor from the internal environmental data, such as the relative humidity and temperature inside of the sensor in view of the saturation of the desiccant. Operation of the sensor may be limited to locations where the temperature inside of the sensor is greater than the dew point.

The features described herein may allow for easy serviceability of desiccant. In this regard a technician may replace the saturated desiccant packs within a desiccant cartridge without the need for tools reducing the time and effort required to maintain the desiccant within the sensor. In addition, maintenance costs may be reduced, as desiccant may be replaced only when environmental conditions deem necessary rather than on a regular cadence service interval. Moreover, the retention and sealing of desiccant cartridge prevents moisture ingress and keep the sensor substantially sealed. In addition, by monitoring the lifespan of the desiccant, the risk of desiccant being over saturated is reduced. Scheduling of vehicle service may also be improved, as life of the desiccant is monitored so service orders can be scheduled based on risk of condensation occurring, rather than a set service interval. Additionally, by determining the dew point of the sensor in view of expected operating locations, safe, condensation-free operation of the sensor may be assured.

Example Systems

Figure 2:
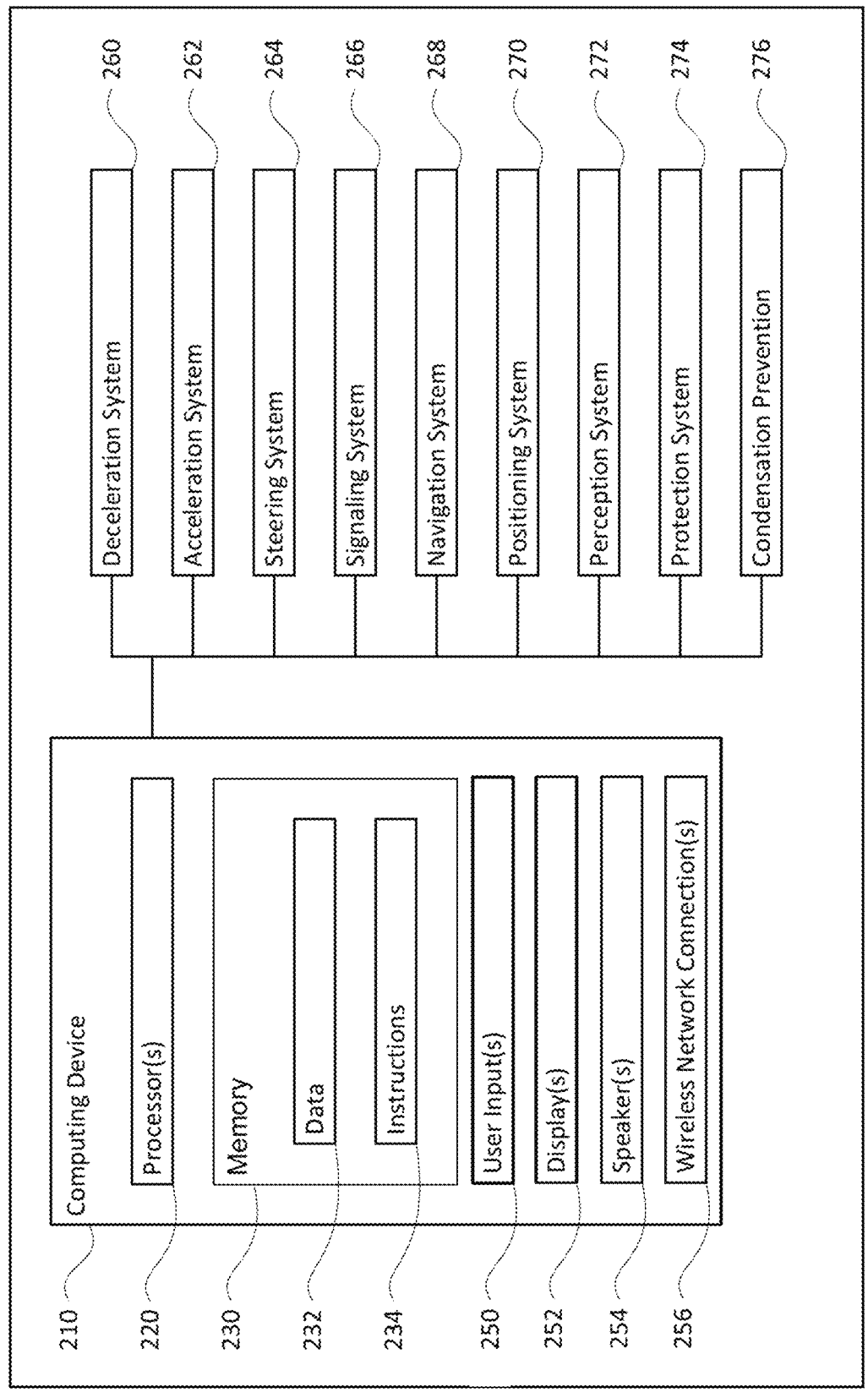
FIG. 2 is a functional diagram of a vehicle in accordance with aspects of the disclosure.

As shown in FIG. 2, a vehicle 200 in accordance with one aspect of the disclosure includes various components. While certain aspects of the disclosure are particularly useful in connection with specific types of vehicles, the vehicle may be any type of vehicle including, but not limited to, cars, trucks, motorcycles, buses, recreational vehicles, flying vehicles, etc. In some instances, certain aspects of the disclosure may be useful in connection with sensors not connected to or otherwise associated with a vehicle. For instance, aspects of the disclosure may be used in any sensor which includes a housing. The vehicle may have one or more computing devices, such as computing device 210, which many be more than one computing device, containing one or more processors 220, memory 230 and other components typically present in general purpose computing devices.

The memory 230 stores information accessible by the one or more processors 220, including instructions 232 and data 234 that may be executed or otherwise used by the processor 220. The memory 230 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 234 may be any set of instructions to be executed directly (such as machine code) or indirectly (such as scripts) by the processor. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 232 may be retrieved, stored or modified by processor 220 in accordance with the instructions 234. For instance, although the claimed subject matter is not limited by any particular data structure, the data may be stored in computing device registers, in a relational database as a table having a plurality of different fields and records, XML documents or flat files. The data may also be formatted in any computing device-readable format.

The processor 220 may be any one or more conventional processors, such as commercially available CPUs. Alternatively, the one or more processors may be a dedicated device such as an ASIC or other hardware-based processor. Although FIG. 2 functionally illustrates the processor, memory, and other elements of computing devices 210 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 210. Accordingly, references to a processor or computing device will be understood to include references to a collection of processors or computing devices or memories that may or may not operate in parallel.

Computing device 210 may include all of the components normally used in connection with a computing device such as the processor and memory described above as well as one or more user inputs 250 (e.g., a mouse, keyboard, touch screen and/or microphone) and various electronic displays (e.g., a monitor having a screen or any other electrical device that is operable to display information). In this example, the vehicle includes one or more internal electronic displays 252 as well as one or more speakers 254 to provide information or audio visual experiences. In this regard, internal electronic display 252 may be located within a cabin of vehicle 200 and may be used by computing devices 210 to provide information to passengers or maintenance personnel within or otherwise in the vicinity of, the vehicle 200.

Computing device 210 may also include one or more wireless network connections 256 to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

In one example, computing device 210 may control the computing devices of an autonomous driving computing system incorporated into vehicle 200. The autonomous driving computing system may capable of communicating with various components of the vehicle in order to control the movement of vehicle 200 according to primary vehicle control code stored in memory 230. For example, computing device 210 may be in communication with various systems of vehicle 200, such as deceleration system 260, acceleration system 262, steering system 264, signaling system 266, navigation system 268, positioning system 270, perception system 272, and power system 274 (i.e. the vehicle's engine or motor) in order to control the movement, speed, etc. of vehicle 200 in accordance with the instructions 234 of memory 230. Again, although these systems are shown as external to computing devices 210, in actuality, these systems may also be incorporated into computing device 210, again as an autonomous driving computing system for controlling vehicle 200.

As an example, computing device 210 may interact with one or more actuators of the deceleration system 260 and/or acceleration system 262, such as brakes, accelerator pedal, and/or the engine or motor of the vehicle, in order to control the speed of the vehicle. Similarly, one or more actuators of the steering system 264, such as a steering wheel, steering shaft, and/or pinion and rack in a rack and pinion system, may be used by computing device 210 in order to control the direction of vehicle 200. For example, if vehicle 200 is configured for use on a road, such as a car or truck, the steering system may include one or more actuators to control the angle of wheels to turn the vehicle. Signaling system 266 may be used by computing devices 210 in order to signal the vehicle's intent to other drivers or vehicles, for example, by lighting turn signals or brake lights when needed.

Navigation system 268 may be used by computing device 210 in order to determine and follow a route to a location. In this regard, the navigation system 268 and/or data 232 may store detailed roadmap information, e.g., highly detailed maps identifying the shape and elevation of roadways, lane lines, intersections, crosswalks, speed limits, traffic signals, buildings, signs, real time traffic information, vegetation, or other such objects and information.

In addition to the map information discussed above, the data 238 may also store environmental map information, such as ambient environmental conditions including, for instance, temperature, relative humidity, dew point, solar irradiance, wind, and air quality measurements or data for specific locations or areas. These environmental maps may thus include fairly detailed information about current conditions at a block by block or street by street granularity. Additional information, such as information collected by stationary sensors mounted at various locations may also be included in the maps. These environmental maps may be sent to the fleet of vehicles, for instance, to the computing devices of such vehicles. In some instances, these maps may be updated in real time at a vehicle based on reports received from a server computing devices or directly other vehicles.

The environmental map may also be supplemented with additional information collected or provided by sources other than the vehicle 200 or vehicles of a fleet of vehicles. For instance, all or some of the environmental map information may be collected by sensors that are fixed proximate to or within the areas represented by such blocks. In addition or alternatively, the environmental map may also include weather information provided by various sources such as online weather reporting services, mobile devices, such as mobile phones, with thermometer or pressure sensors, mobile devices with network access such as mobile phones, tablets or internet of things (IOT) devices, etc.

Positioning system 270 may be used by computing device 210 in order to determine the vehicle's relative or absolute position on a map or on the earth. For example, the positioning system 270 may include a GPS receiver to determine the positioning system's latitude, longitude and/or altitude position. Other location systems such as laser-based localization systems, inertial-aided GPS, or camera-based localization may also be used to identify the location of the vehicle. The location of the vehicle may include an absolute geographical location, such as latitude, longitude, and altitude as well as relative location information, such as location relative to other cars immediately around it which can often be determined with less noise that absolute geographical location.

The positioning system 270 may also include other devices in communication with computing device 210, such as an accelerometer, gyroscope or another direction/speed detection device to determine the direction and speed of the vehicle or changes thereto. By way of example only, an acceleration device may determine its pitch, yaw or roll (or changes thereto) relative to the direction of gravity or a plane perpendicular thereto. The device may also track increases or decreases in speed and the direction of such changes. The device's provision of location and orientation data as set forth herein may be provided automatically to the computing device 210, other computing devices and combinations of the foregoing.

The perception system 272 may also include one or more components for detecting objects external to the vehicle such as other vehicles, obstacles in the roadway, traffic signals, signs, trees, etc. For example, the perception system 272 may include lasers, sonar, radar, cameras and/or any other detection devices that record data which may be processed by computing device 210. In the case where the vehicle is a passenger vehicle such as a minivan, the minivan may include a laser or other sensors mounted on the roof or other convenient location.

Figure 3A:
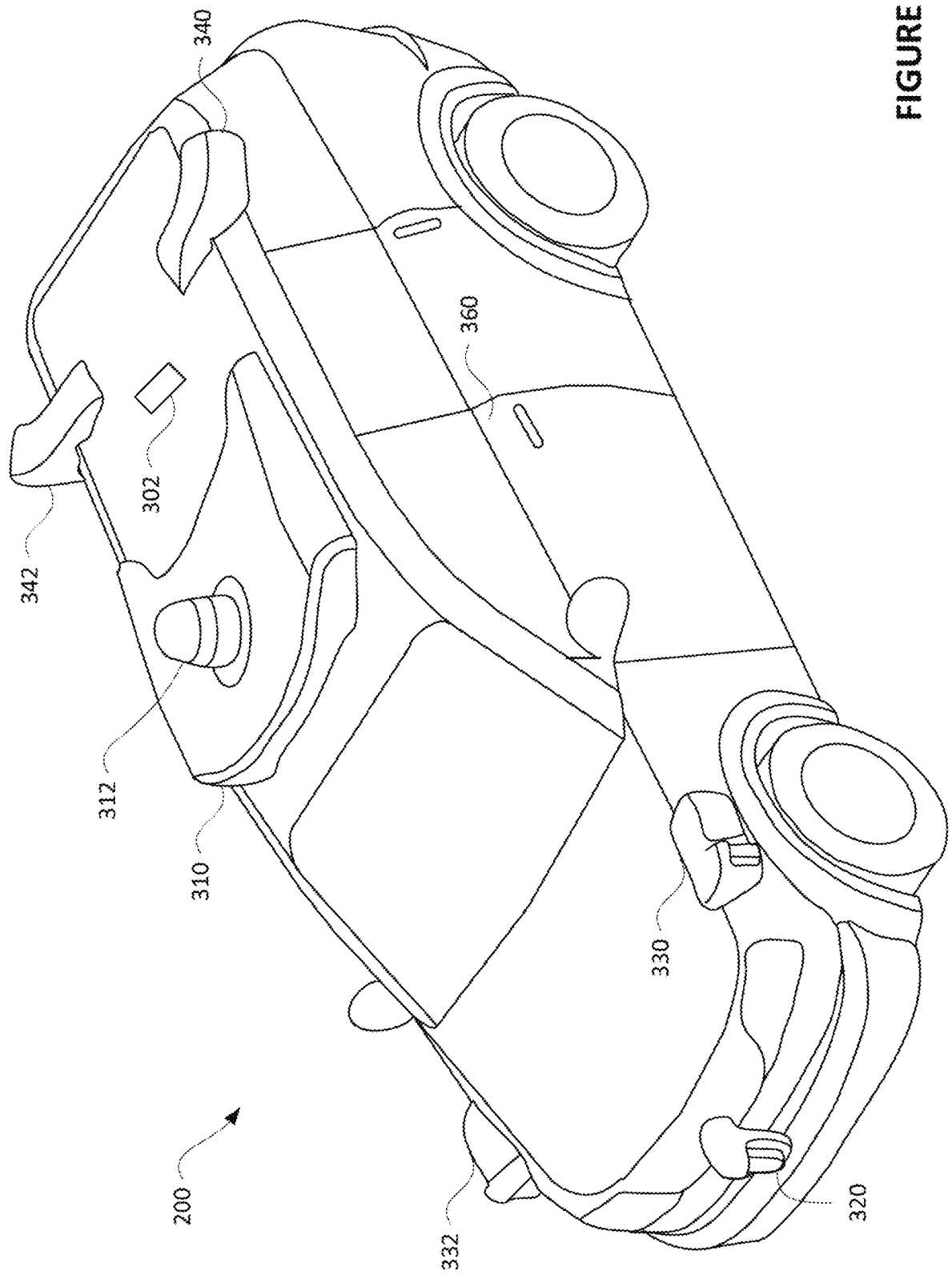
FIG. 3A is an example representative view of a vehicle with sensor housings in accordance with aspects of the disclosure.

For instance, FIG. 3A is an example external view of vehicle 200. In this example, sensor box 302 may house a plurality of sensors, such as one or more thermometers for measuring ambient temperature outside of the vehicle, hygrometers for measuring ambient relative humidity outside of the vehicle, solar irradiance sensors which can measure various wavelengths in the solar radiance spectrum (UV, IR, etc), wind sensors such as anemometers for measuring wind speed and direction, as well as other sensors, such as those that may be used to determine air quality such as those that detect particulate matter (PM). The output of the sensors of the sensor box may be sent to the computing devices 110 for further processing and/or transmission to remote computing devices. The location of the sensor box 302, shown as the roof panel in FIG. 3A, may be selected in order to reduce the likelihood of inaccurate readings due to warm air from other heat sources such as the exhaust system or engine compartment of the vehicle or exhaust gasses from other vehicles. In addition, although sensor box 302 is depicted as a single box at a single location on the vehicle, the aforementioned sensors of the sensor box may actually be housed in a plurality of such sensor boxes located at different locations on the vehicle.

In addition, a roof-top sensor housing 310 and a dome sensor housing 312 may include one or more lidar sensors, cameras, and/or radar units. In addition, housing 320 located at the front end of vehicle 100 and housings 330, 332 on the driver's and passenger's sides of the vehicle may each store a lidar sensor. For example, housing 330 is located in front of driver door 360. Vehicle 200 also includes housings 340, 342 for radar units and/or cameras also located on the roof of vehicle 200. Additional radar units and cameras (not shown) may be located at the front and rear ends of vehicle 200 and/or on other positions along the roof or roof-top sensor housing 310. In this regard, each of housings 310, 312, 320, 330, 332, 340, and 342 may be considered sensor housings any or all of the aforementioned sensors may be considered a part of the vehicle's perception system 272.

FIG. 3B is a representative transparent view of housing 312, FIG. 3C is a representative transparent view of housing 320, FIG. 3D is a representative transparent view of housing 330, and FIG. 3E is a representative transparent view of housing 310. Referring to FIG. 3B, as noted above, the housing 312 may include a lidar sensor (details of which are not shown) as well as various cameras and radar units (details of which are not shown). In addition, the housing may include one or more temperature and relative humidity sensors 350, 352 which can detect and identify current temperature and relative humidity levels within the dome sensor housing. This information may be sent to the computing device 210 for processing, for instance, to determine a dew point for the area within the sensor housing.

Referring to FIG. 3C, housing 320 may include a lidar sensor (details of which are not shown) as well as one or more temperature and relative humidity sensors 360, 362 which can detect and identify current temperature and relative humidity levels within the housing 320. This information may also be sent to the computing device 210 for processing, for instance, to determine a dew point for the area within the sensor housing.

Similarly, referring to FIG. 3D and as noted above, housing 330 may include a lidar sensor (details of which are not shown) as well as one or more temperature and relative humidity sensors 370, 372 which can detect and identify current temperature and relative humidity levels within the housing 330. This information may also be sent to the computing device 210 for processing. Housing 332 may be configured similarly to housing 330, and thus, may also include one or more temperature and relative humidity sensors as well housing 330.

Referring to FIG. 3E, as noted above, the housing 312 may include a lidar sensor (details of which are not shown) as well as various cameras and radar units (details of which are not shown). In addition, the housing may include one or more temperature and relative humidity sensors 380, 382 which can detect and identify current temperature and relative humidity levels within the dome housing. This information may be sent to the computing device 210 for processing, for instance, to determine a dew point for the area within the sensor housing.

The computing device 210 may control the direction and speed of the vehicle by controlling various components. By way of example, computing device 210 may navigate the vehicle to a destination location completely autonomously using data from the detailed map information and navigation system 268. Computing devices 210 may use the positioning system 270 to determine the vehicle's location and perception system 272 to detect and respond to objects when needed to reach the location safely. In order to do so, computing devices 210 may cause the vehicle to accelerate (e.g., by increasing fuel or other energy provided to the engine by acceleration system 262), decelerate (e.g., by decreasing the fuel supplied to the engine, changing gears, and/or by applying brakes by deceleration system 260), change direction (e.g., by turning the front or rear wheels of vehicle 200 by steering system 264), and signal such changes (e.g., by lighting turn signals of signaling system 266). Thus, the acceleration system 262 and deceleration system 260 may be a part of a drivetrain that includes various components between an engine of the vehicle and the wheels of the vehicle. Again, by controlling these systems, computing devices 210 may also control the drivetrain of the vehicle in order to maneuver the vehicle autonomously.

Figure 4:
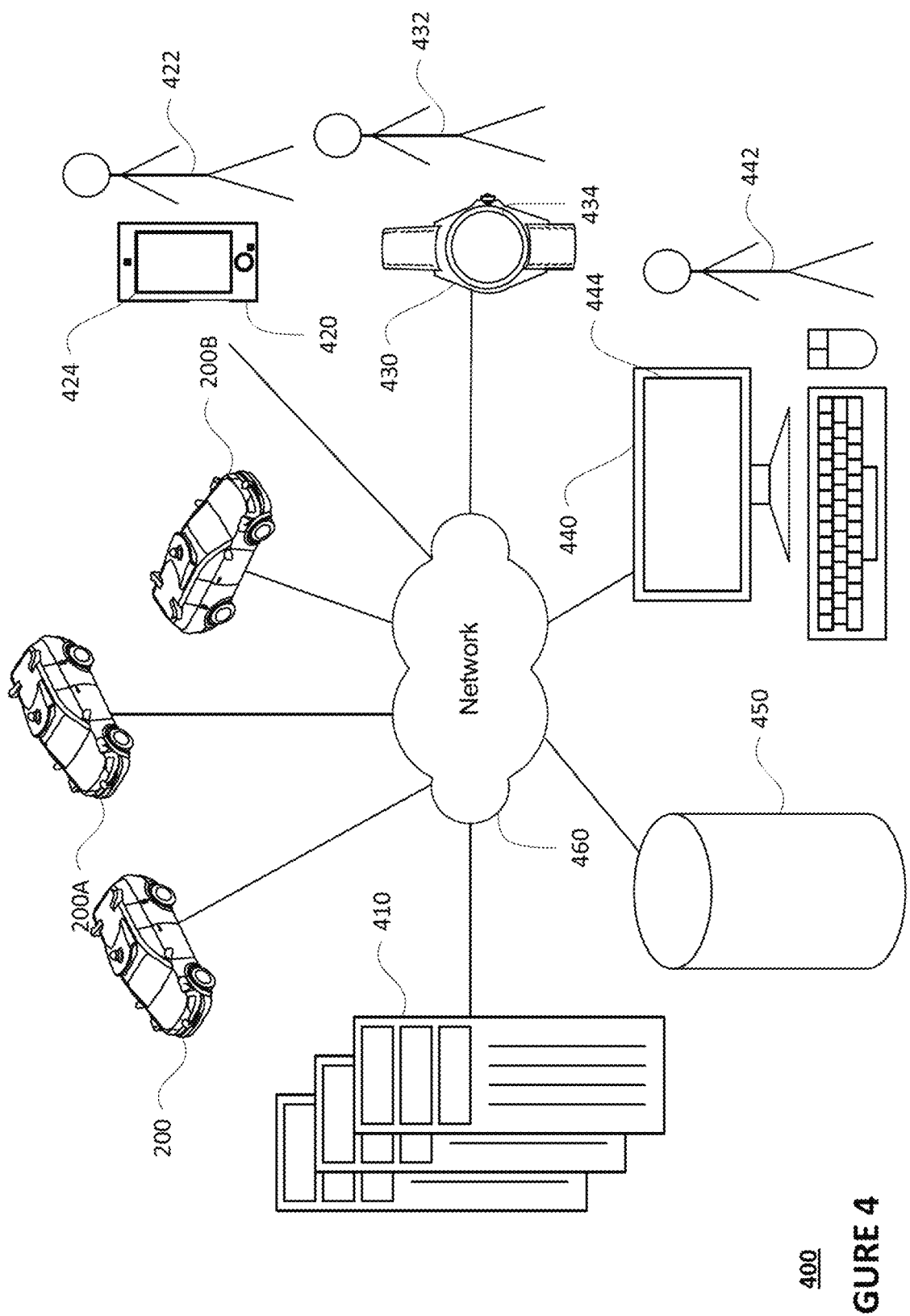
FIG. 4 is a pictorial diagram of an example system in accordance with aspects of the disclosure.
Figure 5:
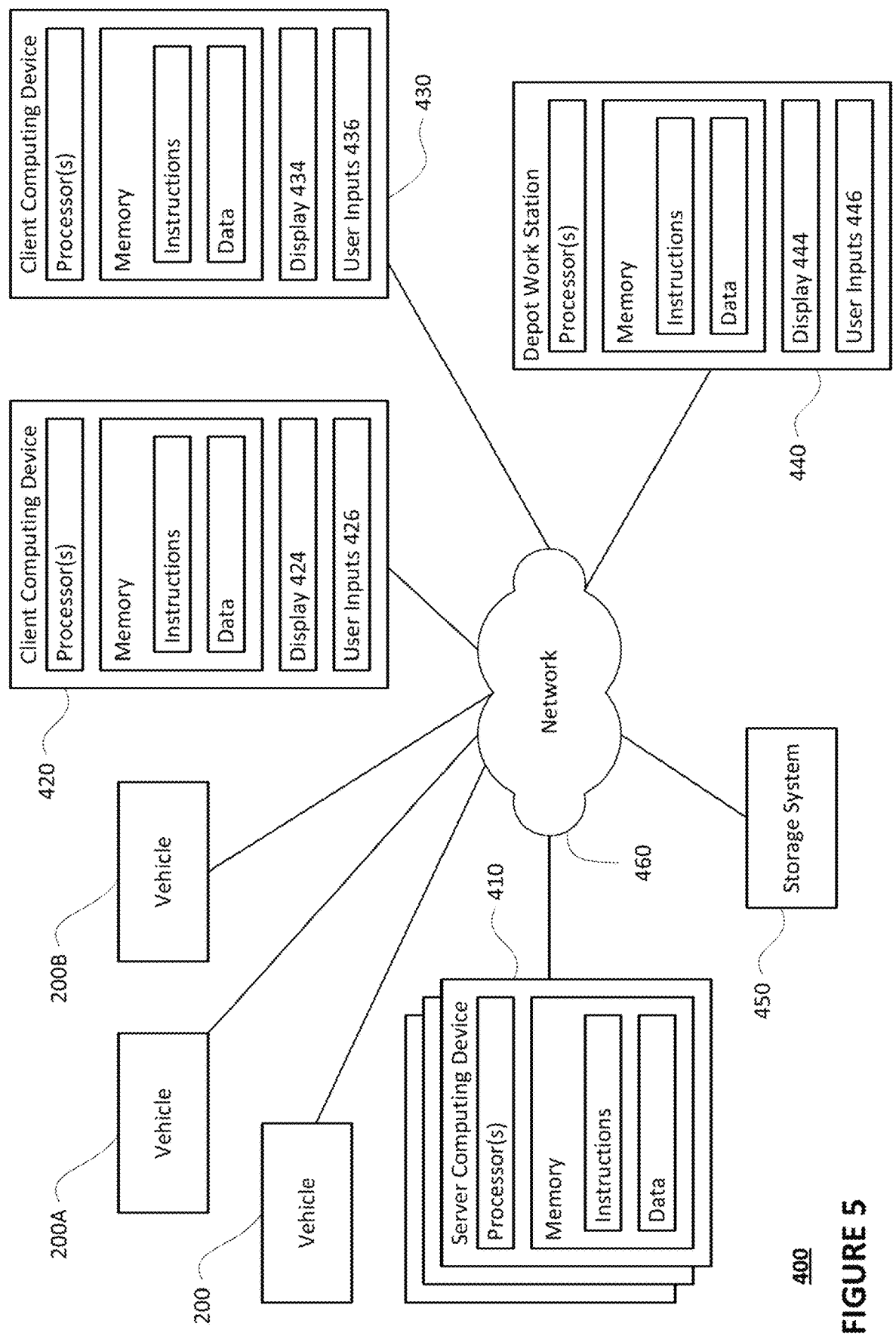
FIG. 5 is a functional diagram of an example system in accordance with aspects of the disclosure.

Computing device 210 of vehicle 200 may also receive or transfer information to and from other computing devices, such as those computing devices that are a part of the transportation service as well as other computing devices. FIGS. 4 and 5 are pictorial and functional diagrams, respectively, of an example system 400 that includes a plurality of computing devices 410, 420, 430, 440 and a storage system 450 connected via a network 460. System 400 also includes vehicle 200, and vehicles 200A, 200B which may be configured the same as or similarly to vehicle 200. Although only a few vehicles and computing devices are depicted for simplicity, a typical system may include significantly more.

As shown in FIG. 4, each of computing devices 410, 420, 430, 440 may include one or more processors, memory, data and instructions. Such processors, memories, data and instructions may be configured similarly to one or more processors 220, memory 230, data 232, and instructions 234 of computing device 210.

The network 460, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing device 210 may include one or more server computing devices having a plurality of computing devices, e.g., a load balanced server farm, that exchange information with different nodes of a network for the purpose of receiving, processing and transmitting the data to and from other computing devices. For instance, one or more computing devices 410 may include one or more server computing devices that are capable of communicating with computing device 210 of vehicle 100 or a similar computing device of vehicle 200A, 200B as well as computing devices 420, 430, 440 via the network 460. For example, vehicles 200, 200A, 200B may be a part of a fleet of vehicles that can be dispatched by server computing devices to various locations. In this regard, the server computing devices 410 may function as a dispatching system. In addition, the vehicles of the fleet may periodically send the server computing devices location and environmental information provided by the vehicle's respective positioning systems as well as other information relating to the status of the vehicles discussed further below, and the one or more server computing devices may track the locations and status of each of the vehicles of the fleet.

In addition, server computing devices 410 may use network 460 to transmit and present information to a user, such as user 422, 432, 442 on a display, such as displays 424, 434, 444 of computing devices 420, 430, 440. In this regard, computing devices 420, 430, 440 may be considered client computing devices.

As shown in FIG. 4, each client computing device 420, 430, 440 may be a personal computing device intended for use by a user 422, 432, 442, and have all of the components normally used in connection with a personal computing device including a one or more processors (e.g., a central processing unit (CPU)), memory (e.g., RAM and internal hard drives) storing data and instructions, a display such as displays 424, 434, 444 (e.g., a monitor having a screen, a touch-screen, a projector, a television, or other device that is operable to display information), and user input devices 426, 436, 446 (e.g., a mouse, keyboard, touchscreen or microphone). The client computing devices may also include a camera for recording video streams, speakers, a network interface device, and all of the components used for connecting these elements to one another.

Although the client computing devices 420, 430, and 440 may each comprise a full-sized personal computing device, they may alternatively comprise mobile computing devices capable of wirelessly exchanging data with a server over a network such as the Internet. By way of example only, client computing device 420 may be a mobile phone or a device such as a wireless-enabled PDA, a tablet PC, a wearable computing device or system, or a netbook that is capable of obtaining information via the Internet or other networks. In another example, client computing device 430 may be a wearable computing system, shown as a wristwatch as shown in FIG. 4. As an example the user may input information using a small keyboard, a keypad, microphone, using visual signals with a camera, or a touch screen.

As with memory 230, storage system 450 can be of any type of computerized storage capable of storing information accessible by the server computing devices 410, such as a hard-drive, memory card, ROM, RAM, DVD, CD-ROM, write-capable, and read-only memories. In addition, storage system 450 may include a distributed storage system where data is stored on a plurality of different storage devices which may be physically located at the same or different geographic locations. Storage system 450 may be connected to the computing devices via the network 460 as shown in FIGS. 4 and 5, and/or may be directly connected to or incorporated into any of the computing devices 210, 410, 420, 430, 440, etc.

Storage system 450 may store various types of information as described in more detail herein. This information may be retrieved or otherwise accessed by a server computing device, such as one or more server computing devices 410, in order to perform some or all of the features described herein. For instance, as the vehicles of the fleet drive around, such as vehicles 200, 200A, and 210B, these vehicles may constantly and/or periodically broadcast to the dispatching system 410 information about the environmental conditions through which such vehicles are currently driving. This may include, for example, information from the sensor boxes 302 of the vehicles of the fleet of vehicles. The dispatching system 410 may store and/or update this environmental information in storage system 450. For instance, the dispatching system 410 may maintain an environmental map including environmental information the same as or similar to the environmental map. In this regard, the server computing devices 410 may receive and/or retrieve information from sources other than the fleet of vehicles, such as the aforementioned stationary devices and or other sources of information such as online weather reporting services, etc.

Figure 6:
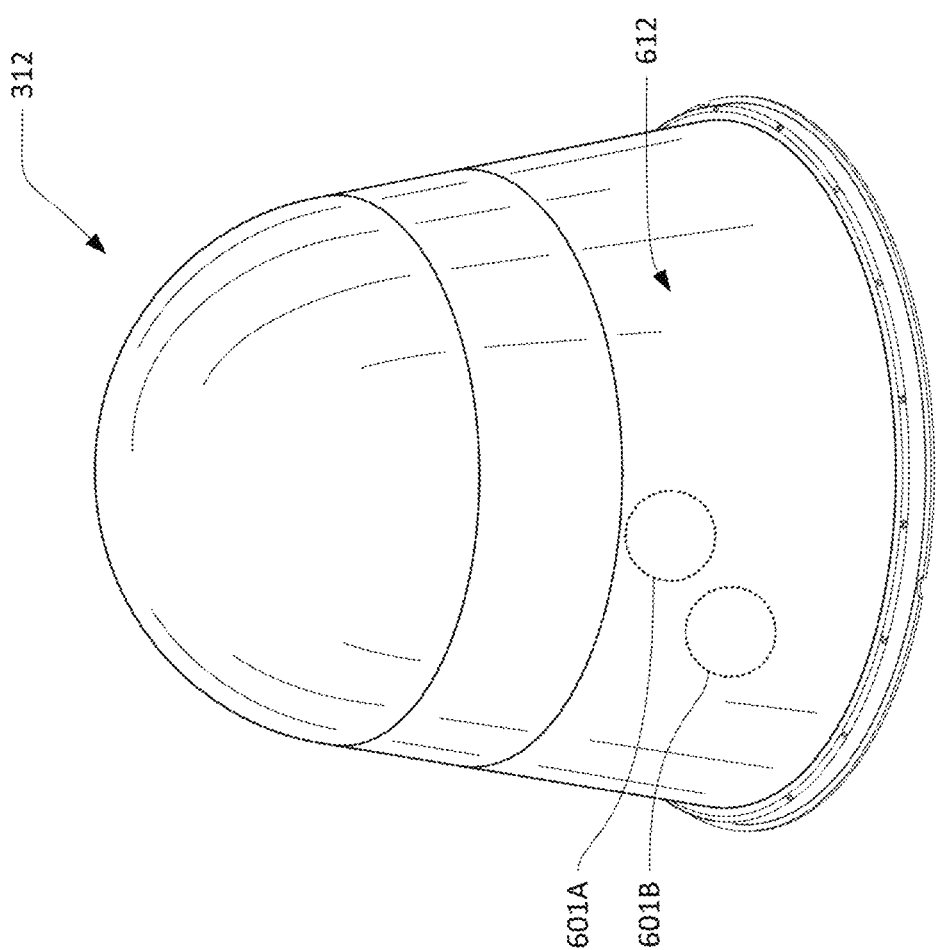
FIG. 6 is an illustration of a sensor housing having desiccant cartridges in accordance with aspects of the disclosure.

A desiccant may be positioned within the interior of the sensor housing to absorb water vapor and prevent or minimize condensation formation. For instance, as illustrated in FIG. 6, the interior 612 of dome sensor housing 312 includes two desiccant cartridges 601A and 601B, which absorb the water vapor to reduce the temperature at which condensation occurs. Thus, the amount of condensation which may build-up on the interior 612 of the dome sensor housing 312 may be reduced or otherwise prevented entirely. Upon becoming saturated, the desiccant within the cartridges, or the desiccant cartridges 601A and 601B themselves, may be replaced. Although the examples herein show dome sensor housing 312, the desiccant cartridges may be configured to work on with any sensor housing.

Figure 7:
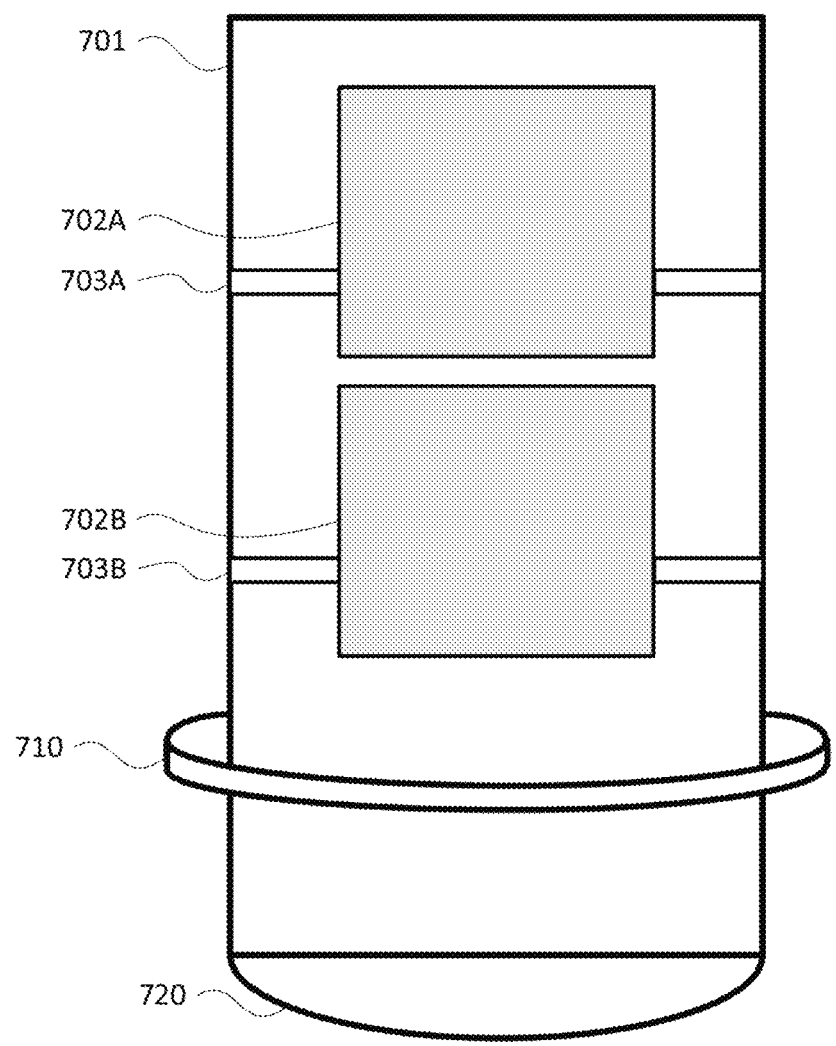
FIG. 7 is a desiccant cartridge in accordance with aspects of the disclosure.

The desiccant may be stored in one or more pouches and positioned within the desiccant cartridge. In this regard, the pouches may be placed or otherwise attached to the interior of the desiccant cartridge via a strap, clasp, etc. For instance, and as illustrated in FIG. 7, pouches 702A and 702B are mounted within desiccant cartridge 701, which may be compared to desiccant cartridges 601A and 601B. Straps 703A and 703B secure desiccant pouches 702A and 702B, respectively, within the interior of the desiccant cartridge 701. In some instances, desiccant may be added directly to the desiccant cartridge, without the use of a pouch.

The desiccant cartridge and pouches may both being permeable to allow air, and the water vapor contained therein, to pass through the pouches. The pouches may also prevent the desiccant from scattering into the interior of the sensor while allowing for easy removal and replacement from the desiccant cartridge. For instance, pouches 702A and 702B may be made of commercially available TYVEK® which is moisture permeable and capable of securing desiccant within. In instances where desiccant is added directly to a desiccant cartridge, the walls of the desiccant cartridge may be configured such that they maintain the desiccant, while still allowing air and the water vapor contained therein to pass through.

The amount of desiccant within the desiccant cartridges and/or pouches may be adjusted based on the amount of moisture absorption required within the sensor housing. As an example, the desiccant within pouches 702A and 702B may be expected to absorb 20% of its weight in moisture, or more or less.

The useable lifespan of the desiccant within a desiccant cartridge may be based upon the environment which the desiccant is subjected. As discussed previously, in warmer, more humid environments, the lifespan of the desiccant may be shorter than desiccant in colder, dryer environments as the desiccant will saturate more quickly in the warmer, more humid environment as more moisture is present. Moreover, as the desiccant saturates, the less effective it becomes at preventing the formation of condensation within the sensor housing.

The desiccant cartridge may be configured to removeably attach to the sensor. In this regard, the desiccant cartridge may include a handle to allow a user to screw on and off the desiccant cartridge from the sensor. In some instances, the desiccant cartridge may be configured with screw threads. For instance, as further shown in FIG. 7, desiccant cartridge 701 may include a handle 720 for turning the cartridge and screw threads 710. The screw threads may be configured such that by turning the desiccant cartridge 701 a predetermined distance, such as a quarter rotation, or more or less, the desiccant cartridge 701 may securely attach to the sensor housing, such as dome sensor housing 312. In some instances, the desiccant cartridge 701 may include a bolt head or screwdriver head in conjunction with, or in place of the handle. Although not shown, the desiccant cartridge 701 may include a seal, such as a rubber or silicone seal around the mounting screw. Upon insertion into the sensor, the seal may contact a portion of the sensor to create a moisture and air tight seal between the sensor housing and the desiccant cartridge.

Figure 8B:
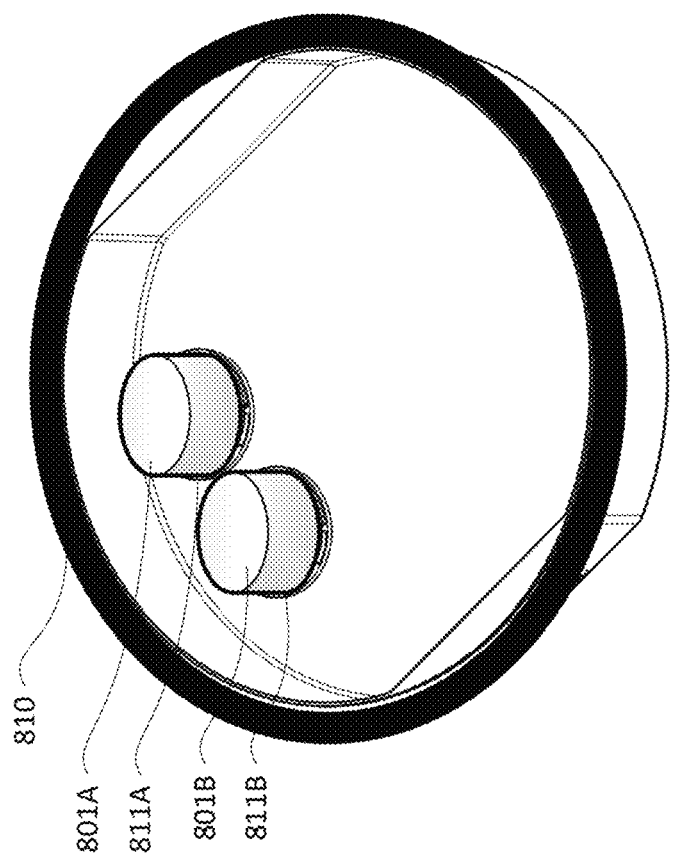
FIGS. 8A and 8B are illustrations of mounts positioned on a sensor housing in accordance with aspects of the disclosure.
Figure 8A:
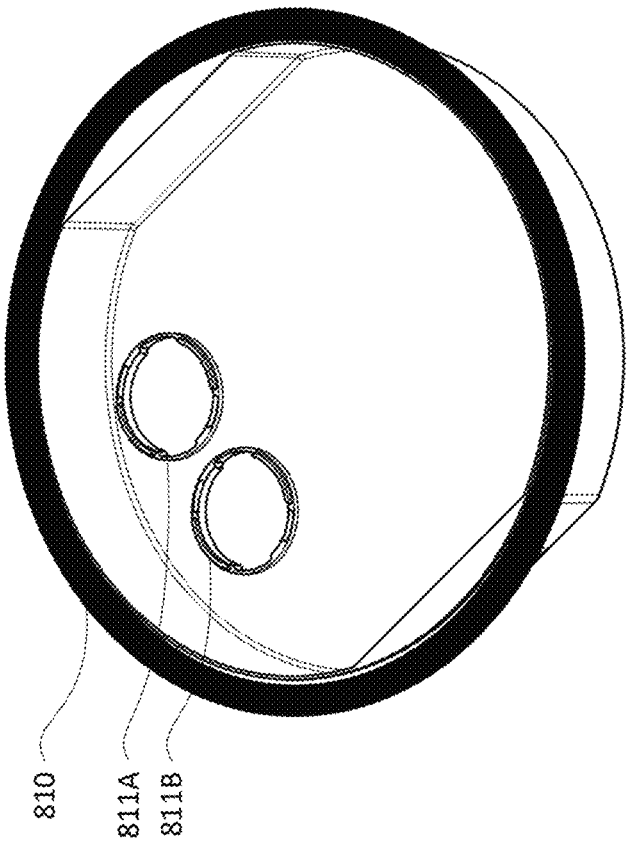

The sensor housing may be configured with mounts to allow one or more desiccant cartridges to be removeably connected. For instance, as shown in FIG. 8A, the base of a sensor's housing 810 may be fitted with screw mounts 811A and 811B in which a pair of desiccant cartridges may be mounted securely to the base sensor housing 810. In this regard, the desiccant cartridges 801A and 801B may be inserted from outside the base of the sensor housing 810 and inserted into the mounts 811A and 811B, respectively, as shown in FIG. 8B. The desiccant cartridge 801A and 801B may be locked into position, as further shown in FIG. 8B, by rotating the desiccant cartridges, as described herein. Although FIGS. 8A and 8B illustrate the mounts 811A and 811B as being in the base of the sensor, the mounts may be positioned anywhere on or within the sensor housing where desiccant may be needed, such as on the walls, window, dome, etc., of the sensor housing, suspended within the interior of the sensor housing, positioned in proximity to the internal components of the sensor, etc. Although not shown, the desiccant cartridge and mount may have corresponding designs such that the desiccant cartridge may be input into the mount only in a particular direction/orientation.

Figure 9:
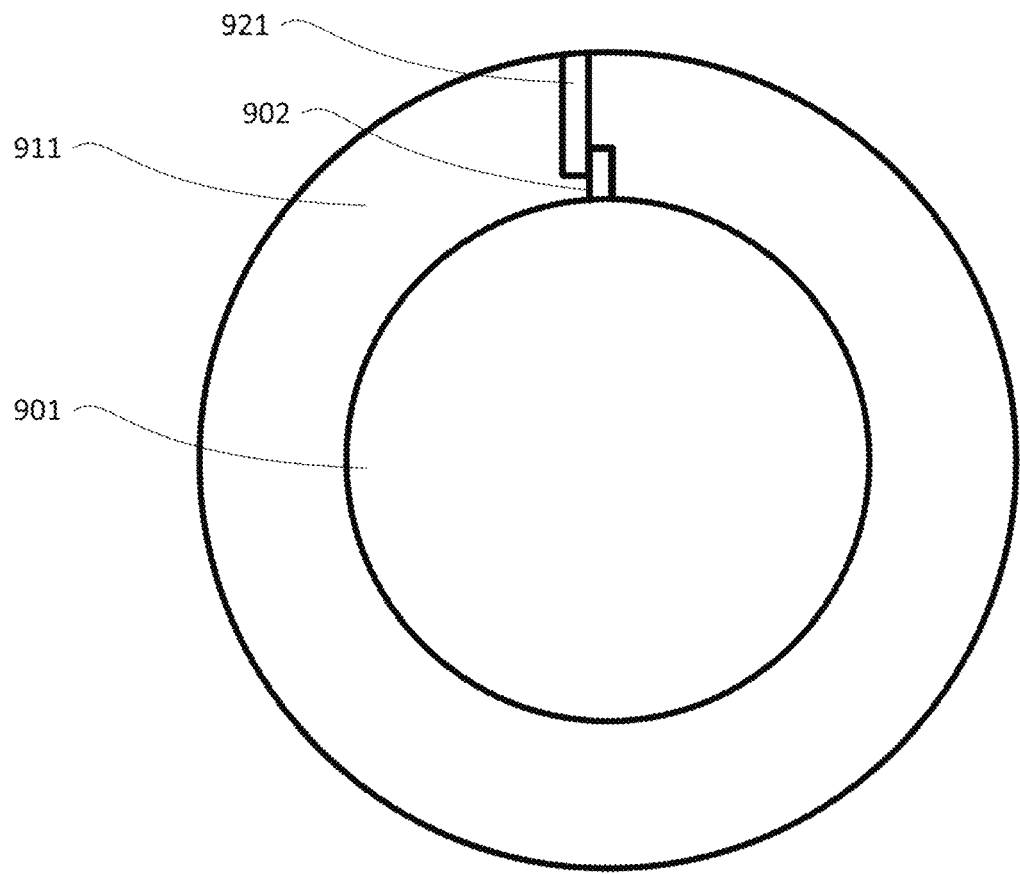
FIG. 9 is a top down illustration of a desiccant cartridge and mount having stops in accordance with aspects of the disclosure.

In some instances, the mounts may include a stop to prevent an operator from over-tightening the desiccant cartridge. The stop may include a stop on the mount which contacts a corresponding stop on the desiccant cartridge to prevent further rotation of the cartridge. For instance, FIG. 9 illustrate a mount 911, which may be compared to mounts 811A and 811B, having a stop 921. A desiccant cartridge 901, which may be compared to cartridges 701, 801A, and 801B, may include a corresponding stop 902. The desiccant cartridge 901 may be tightened within the mount 911 by rotating the cartridge 901 and/or the mount 911 until the stop 902 of the cartridge contacts the stop of the mount 921. Although only one stop is shown on each of the cartridge and the mount, any number of stops may be present.

Figure 10:
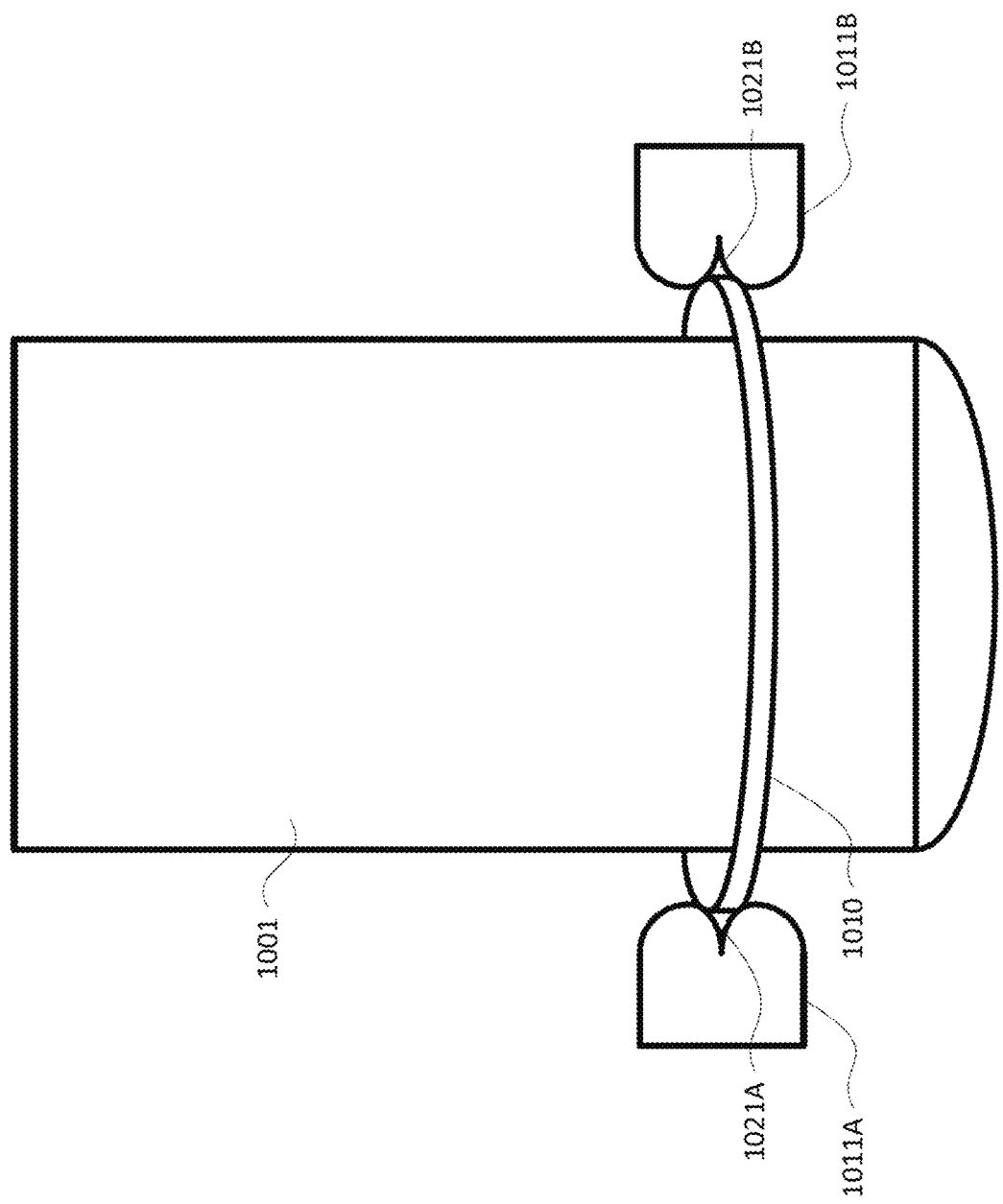
FIG. 10 is an illustration of a desiccant cartridge and corresponding mount having interlocking components in accordance with aspects of the disclosure.

Although the desiccant cartridge and mount are shown as being threaded, screw types, other mounting systems may be used. For instance, the mount may include a clamp which securely grips the desiccant cartridge when tightened. In this situation, the desiccant cartridge may not include screw threads. In another example, the mount and desiccant cartridge may be molded or otherwise formed such that they have interlocking components. For example, desiccant cartridge 1001, which may be compared to cartridges 701, 801A, 801B, and 901 may formed such that it has a ridge 1010, as shown in FIG. 10. Mounts 1011A and 1011B have depressions 1021A and 1022B, respectively, in which the ridge 1010 may be positioned. In this regard, upon the desiccant cartridge 1001 being inserted into the cartridge, the interlocking components (i.e., ridge 1010 and mounts 1011A and 1011B,) may connect together to hold the desiccant cartridge 1001 in place.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

Internal and external environmental data may be collected for locations where a sensor, such as a sensor within dome sensor housing 312 on vehicle 200, has operated. In some instance, the data regarding environmental conditions may come from other sensors, weather stations and/or other usual weather sources. As previously discussed, environmental data may include fairly detailed information about current conditions at a block by block or street by street level, such as temperature and relative humidity levels. Internal environmental data, indicative of the temperature and relative humidity conditions within the interior of the sensor, may be collected by a temperature and/or humidity sensor within the sensor housing.

A computing device, such as computing device 210, may determine the operational lifespan of the desiccant, such as the desiccant within the sensor housing, based upon the internal and external environmental data. In this regard, the absolute humidity within the sensor, such as within the sensor housing, may be determined from the relative humidity and temperature data of the sensor's internal environment (i.e., within the sensor housing). Absolute humidity within the sensor may then be compared against the absolute humidity of the external environment to approximate saturation percentage of the desiccant.

The absolute humidity of the external environment may be measured by one or more sensors on or in the vicinity of the vehicle, such as one or more humidity sensors on another vehicle, such as vehicles 200A or 200B. In some instances the absolute humidity of the external environment may be provided to the computing device 210 by a remote weather service. The average absolute humidity of the external environment may be representative of the humidity of the external environment over a period of time, such as one day, or more or less. The external environment may be near or at the last known location of the vehicle, or some other area or areas where the vehicle was located during the period of time.

The saturation percentage of the desiccant may be determined by comparing absolute humidity of the external environment against the absolute humidity within the sensor. For instance, the average absolute saturation may be calculated by dividing the average absolute humidity by the average absolute humidity of the external environment observed for that day at the last known location of the vehicle 200. When the saturation percentage of the desiccant satisfies a threshold, such as 90% or more or less, the computing device may generate an alert requesting service and/or replacement of the desiccant cartridge. By determining the saturation percentage of the desiccant based on absolute humidity of the external environment against the absolute humidity within the sensor, the saturation percentage of the desiccant can be determined without having to weigh the desiccant to determine how much water vapor it has absorbed.

The computing device 210 may determine the dew point within the sensor from the internal environmental data, such as the relative humidity and temperature inside of the sensor. Based on the dew point within the sensor housing, determinations as to what environments the sensor may be subjected to without risk of condensation forming may be made. As discussed herein, the more saturated a desiccant becomes, the less effective it is at absorbing additional moisture. As such, sensors having desiccant cartridges with more saturated desiccants may not be able to operate in the same environments has sensors having desiccant cartridges with less saturated desiccants, since the dew point within the sensors having saturated desiccants may be higher than the sensors with less saturated desiccants.

Based upon the dew point within the sensor housing and temperature data corresponding to locations where the sensor is expected to travel and/or is currently located, a condensation risk may be determined. In this regard, when a sensor and/or vehicle is expected to travel along a projected path or with a particular area, such as within a city's boundaries, having a location forecasted to have a temperature below or within a certain threshold of the dew point, a risk determination of whether condensation may develop in the sensor may be made. For example, when the current conditions of the sensor show a dew point of the sensor is 38 degrees Fahrenheit and a threshold of 5 degrees is used, and the sensor is to be subjected to 42 degree Fahrenheit temperatures during travel, the risk of condensation may be high. In the event the sensor is to be subjected to 50 degree Fahrenheit temperature during travel, the risk for condensation may be low.

In instances where the risk of condensation is found to be high, an alert may be generated that indicates the sensor may not operate properly on the path. Furthermore, the sensor may be prevented from traveling along the projected path. In the event a determination is made that the sensor may not operate properly on a projected path, the path of the sensor may be adjusted such that a path is generated which does not include a temperature below the threshold of the dew point. The sensor may be permitted to travel the adjusted path. In instances where the vehicle is currently located, or will be located, in a location with high condensation risk, the vehicle may be taken out of operation. In some instances, the condensation risk of a location for future time periods may be determined, for example, by monitoring weather forecasts. In the event the condensation risk for a future time period is high, the vehicle may be moved from that location before the future time period to allow the vehicle to remain in operation. In some instances, a work or service order may be generated requesting that the desiccant cartridge within the sensor be changed.

Figure 11:
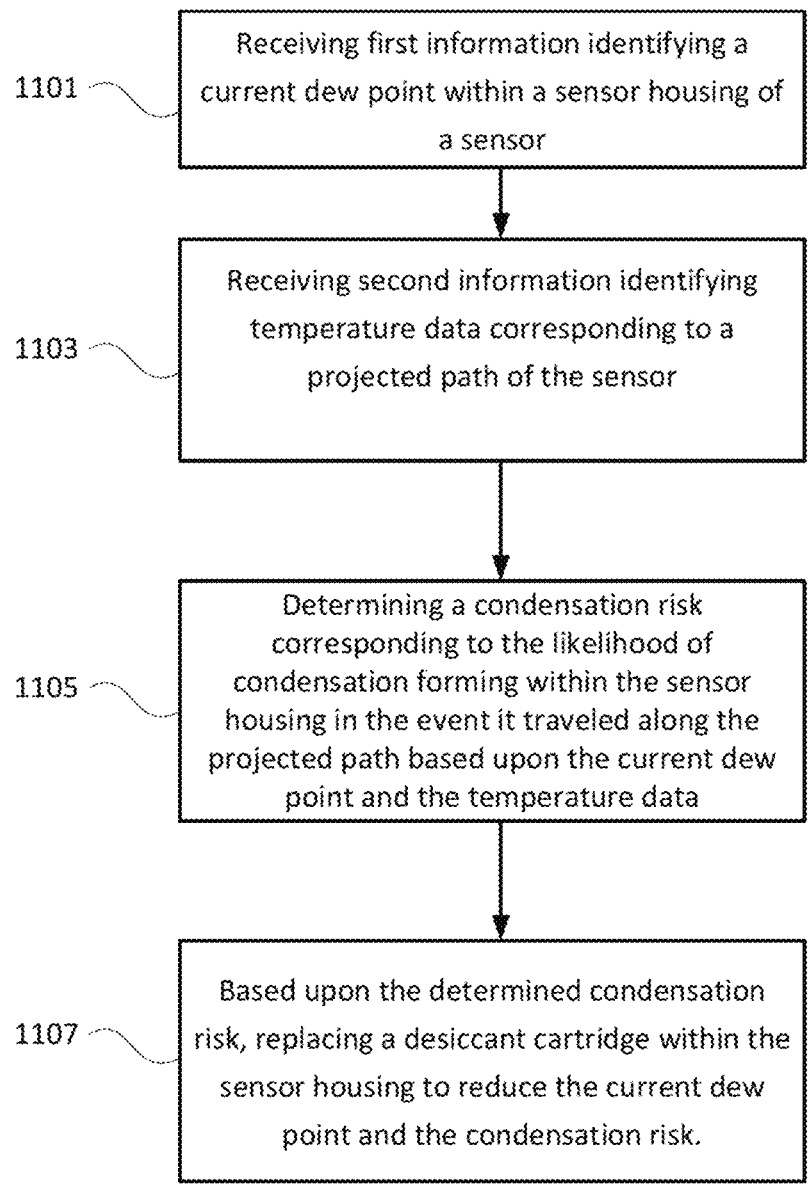
FIG. 11 is an example flow diagram in accordance with aspects of the disclosure.

FIG. 11 includes an example flow diagram 1100 of some of the examples for controlling a vehicle as described above. In this example, the steps of flow diagram may be performed by one or more processors of one or more computing devices, such as processors 120 of computing devices 110 of vehicle 100. For instance at block 910, first information identifying a current relative humidity level within a sensor housing of a vehicle having an autonomous driving mode is received. At block 920, the relative humidity level and pre-stored environmental map information are used to estimate a condition of a sensor within the sensor housing at a future time. At block 930, the vehicle is controlled in accordance with the estimated condition.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method comprising:
receiving, by one or more processors, first information corresponding to a saturation percentage of a desiccant within a sensor housing of a sensor of a vehicle; receiving, by the one or more processors, second information identifying temperature data corresponding to the first route along which the vehicle is projected to travel; determining, by the one or more processors, a condensation risk corresponding to a likelihood of condensation forming within the sensor housing in the event that the vehicle travels the first route based upon the saturation percentage and the temperature data; and
based upon the determined condensation risk, determining a second route for the vehicle to travel.

2. The method of claim 1, further comprising, controlling, by the one or more processors, the vehicle based on the second route.

3. The method of claim 1, further comprising determining a dew point within the sensor housing based on the saturation percentage, and wherein determining the condensation risk is further based on the dew point.

4. The method of claim 3, wherein the second route is generated to avoid temperatures below the dew point.

5. The method of claim 1, wherein the first information includes a temperature and relative humidity level within the sensor housing.

6. The method of claim 5, further comprising determining a dew point within the sensor housing based on the temperature and relative humidity level, and the saturation percentage of the desiccant, and wherein determining the condensation risk is further based on the dew point.

7. The method of claim 1, wherein determining the second route is further based on a threshold saturation percentage.

8. The method of claim 1, wherein determining the condensation risk is further based on a comparison of a threshold value relative to a dew point within the sensor housing.

9. The method of claim 8, wherein determining the second route for the vehicle to travel is further based on the threshold value.

10. The method of claim 1, wherein the condensation risk is based on a range of temperatures.

11. The method of claim 10, wherein condensation risk is greater when the temperature is within the range of temperatures and less when the temperature data is outside of the range of temperatures.

12. The method of claim 1, wherein the second route is generated to avoid temperatures below a dew point.

13. A system comprising one or more computing devices having one or more processors configured to:
receive first information corresponding to a saturation percentage of a desiccant within a sensor housing of a sensor of a vehicle;
receive second information identifying temperature data corresponding to a first route along which the vehicle is projected to travel;
determine a condensation risk corresponding to a likelihood of condensation forming within the sensor housing in the event that the vehicle travels the first route based upon the saturation percentage and the temperature data; and
based upon the determined condensation risk, determining a second route for the vehicle to travel.

14. The system of claim 13, wherein the one or more processors are configured to control the vehicle based on the second route.

15. The system of claim 13, wherein the one or more processors are further configured to determine a dew point within the sensor housing based on the saturation percentage, and wherein determining the condensation risk is further based on the dew point.

16. The system of claim 15, wherein the one or more processors are configured to generate the second route to avoid temperatures below the dew point.

17. The system of claim 13, wherein the first information includes a temperature and relative humidity level within the sensor housing.

18. The system of claim 17, wherein the one or more processors are further configured to determine a dew point within the sensor housing based on the temperature and relative humidity level, and the saturation percentage of the desiccant, and wherein determining the condensation risk is further based on the dew point.

19. The system of claim 13, wherein the condensation risk is based on a range of temperatures.

20. The system of claim 13, further comprising the vehicle.

* * * * *